(12) United States Patent
Higgins et al.

(10) Patent No.: US 6,392,919 B1
(45) Date of Patent: May 21, 2002

(54) REDUCTION OF IMPRINT IN FERROELECTRIC DEVICES USING A DEPOLING TECHNIQUE

(75) Inventors: Mark J. Higgins, Cranbury; Ajit Krishnan, Hightstown, both of NJ (US); Sabyasachi Bhattacharya, New York, NY (US); Michael M. J. Treacy, Princeton, NJ (US)

(73) Assignee: NEC Research Institute, Inc., Princeton, NJ (US)

( * ) Notice: Subject to any disclaimer, the term of this patent is extended or adjusted under 35 U.S.C. 154(b) by 0 days.

(21) Appl. No.: 09/855,040

(22) Filed: May 14, 2001

Related U.S. Application Data

(62) Division of application No. 09/644,222, filed on Aug. 23, 2000.

(51) Int. Cl.[7] .............................................. G11C 11/22
(52) U.S. Cl. ...................................... 365/145; 365/199
(58) Field of Search .......................... 365/145, 20, 199, 365/65, 117

(56) References Cited

U.S. PATENT DOCUMENTS 5,740,100 A * 4/1998 Yoo ............................ 365/145
6,108,111 A * 8/2000 Thakoor et al. ............ 359/107

OTHER PUBLICATIONS

Warren, W.L., et al., "Voltage shifts and imprint in ferroelectric capacitors", Appl. Phys. Lett.; 67 (6), pp. 866–868, Aug. 7, 1995.

Lee, E.G., et al., "Voltage shift and deformation in the hysteresis loop of Pb(Zr, Ti)O3 thin film by defects", Appl. Phys. Lett. 69 (9), pp. 1223–1225, Aug. 26, 1996.

Pike, G.E., et al., "Voltage offsets in (Pb,La)(Zr,Ti)O3 thin films", Appl. Phys. Lett. 66 (4),, 484–486, Jan. 23, 1995.

Schubring, N.W., et al., "Ferroelectric Hysteresis Tracer Featuring Compensation and Sample Grounding", The Review of Scientific Instruments, vol. 35, No. 11, pp. 1517–1521, Nov. 1964.

Mihara, T., et al., "Evaluation of Imprint Properties in Sol–Gel Ferroelectric Pb(ZrTi)O3 Thin–Film Capacitors", Japan. J. Appl. Phys.. vol. 32, Pt. 1, No. 9B, pp. 4168–4174, 1993.

* cited by examiner

Primary Examiner—David Nelms
Assistant Examiner—Thong Le
(74) Attorney, Agent, or Firm—Scully, Scott, Murphy & Presser

(57) ABSTRACT

A method for reducing imprint in a ferroelectric device which includes the steps of: applying a signal having a bipolar pulse shape for a predetermined time to the ferroelectric device; and decreasing the signal amplitude gradually in predetermined intervals of time and amplitude. Preferably, the bipolar shape signal is a sinusoidal wave, a square wave, or a sawtooth wave and the ferroelectric device is a capacitor of a memory cell in a computer. Also provided is an apparatus for reducing imprint in a ferroelectric device.

12 Claims, 5 Drawing Sheets

REDUCTION OF IMPRINT IN FERROELECTRIC DEVICES USING A DEPOLING TECHNIQUE

CROSS REFERENCE TO RELATED APPLICATIONS

The present application is a divisional of copending application U.S. Ser. No. 09/644,222 filed on Aug. 23, 2000.

BACKGROUND OF THE INVENTION

1. Field of the Invention

The present invention relates generally ferroelectric capacitors and, more particularly, to reducing imprint in ferroelectric capacitors.

2. Prior Art

Imprint refers to the preference of one polarization state over another in a ferroelectric [T. Mihara, H. Watanabe and C. A. Pas De Araujo, Jpn. J. Appl. Phys. 32 4168 (1993)]. This is typically observed as an asymmetry in the hysteresis loop, or polarization versus applied voltage (P–V), whereby the loop is shifted along the voltage axis. Such voltage shifts can lead to failure of a ferroelectric memory device, as either the coercive field becomes too large in one direction, or the two polarization states become indistinguishable to the sense amplifier.

Imprint can be induced in ferroelectric capacitors by a number of different processes [Id. and W. L. Warren, D. Dimos, G. E. Pike, B. A. Tuttle, M. V. Raymond, R. Ramesh and J. T. Evans Jr., Appl. Phys. Lett. 67 (6), 866 (1995)]. In the case of lead zirconate titanate (PZT), samples cooled from the processing temperature (650° C.) in a oxygen reducing atmosphere will typically show an asymmetry in voltage across a capacitor ($\pm V_o$) at room temperature. Under the right conditions, heating the PZT under an applied bias, or applying ultra violet (UV) light, can also result in imprint. Additionally, a unipolar pulse large enough to pole the sample, for $10^9$ or more cycles can be applied. The unipolar pulses, while not fatiguing the sample, will produce a voltage shift in the P–V curve opposite in direction to the pulse polarity.

There are methods known in the art for either reducing or eliminating imprint effects in ferroelectric devices. However, they involve either heating the ferroelectric devices to temperatures of 100° C. and above while poling, exposing the ferroelectric devices to UV light, or a post annealing treatment under an oxygen ambient [See G. E. Pike, W. L. Warren, D. Dimos, B. A. Tuttle, R. Ramesh, J. Lee, V. G. Keramidas and J. T. Evans Jr., Appl. Phys. Lett. 66 (6), 484 (1995) and E. G. Lee, D. J. Wouters, G. Willems and H. E. Maes, Appl. Phys. Lett. 69, 1223 (1996)]. While useful, these approaches are not practical for certain applications of ferroelectric devices, such as in computer memory.

SUMMARY OF THE INVENTION

Therefore, it is an object of the present invention to provide a method for reducing or eliminating imprint effects in ferroelectric devices without exposing the ferroelectric devices to excessive temperatures.

It is a further object of the present invention to provide a method for reducing or eliminating imprint effects in ferroelectric devices without exposing the ferroelectric devices to UV light.

It is yet a further object of the present invention to provide a method for reducing or eliminating imprint effects in ferroelectric devices without exposing the ferroelectric devices to a post annealing treatment under an oxygen ambient.

It is still yet a further object of the present invention to provide a method for reducing or eliminating imprint effects in ferroelectric devices which can be applied to ferroelectric memory cells in a computer.

Accordingly, a method for reducing imprint in a ferroelectric device is provided. The method comprises the steps of: applying a signal having a bipolar pulse shape for a predetermined time to the ferroelectric device; and decreasing the signal amplitude gradually in predetermined intervals of time and amplitude.

Also provided is an apparatus for reducing imprint in a ferroelectric device. The apparatus comprises: means for applying a signal having a bipolar pulse shape for a predetermined time to the ferroelectric device; and means for decreasing the signal amplitude gradually in predetermined intervals of time and amplitude.

Preferably, the bipolar shape signal is one of a sinusoidal wave, square wave, or sawtooth wave and the ferroelectric device is a capacitor or a memory cell of a computer.

BRIEF DESCRIPTION OF THE DRAWINGS

These and other features, aspects, and advantages of the methods of the present invention will become better understood with regard to the following description, appended claims, and accompanying drawings where:

DETAILED DESCRIPTION OF THE PREFERRED EMBODIMENT

Although this invention is applicable to numerous and various types of ferroelectric devices and bipolar pulse shapes, it has been found particularly useful in the environment of capacitors and sinusoidal pulse waves. Therefore, without limiting the applicability of the invention to capacitors and sinusoidal pulse waves, the invention will be described in such environment.

Figure 1:
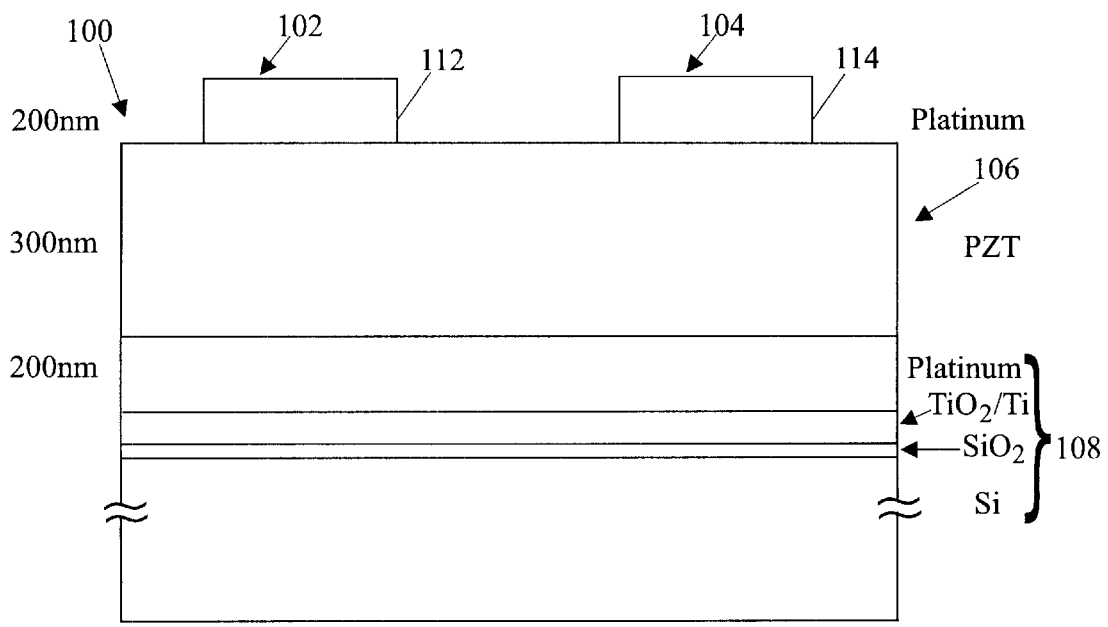
FIG. 1 illustrates a sectional view of a ferroelectric device used in testing the effects of the methods of the present invention.

Referring now to FIG. 1, a method for reducing the effects of imprint in a ferroelectric device is described, the ferroelectric device is referred to generally by reference numeral 100. FIG. 1 illustrates first and second capacitors 102, 104 which comprise sol-gel grow PZT 106 deposited on a Pt/Ti/TiO$_2$/SiO$_2$/Si substrate 108. The sol-gel method is well known in the art and details thereof are omitted here for the sake of brevity. First and second top electrodes 112, 114 are added to the PZT layer 106. Test equipment connections are made to the first and second top electrodes 112, 114, in effect measuring two equal capacitors 102, 104 in series.

Figure 2:
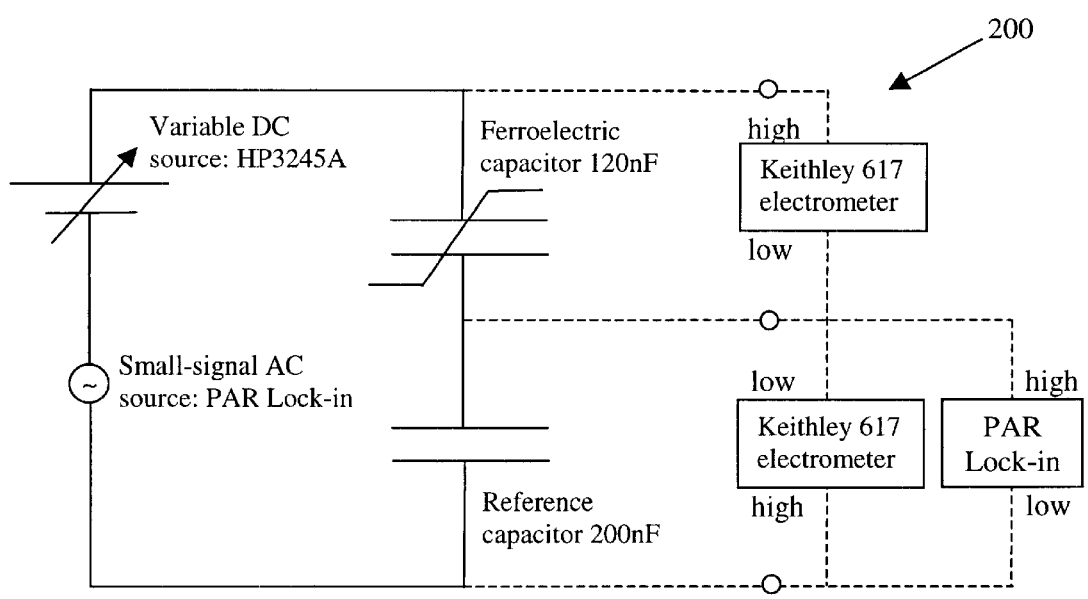
FIG. 2 illustrates an electrical schematic of a modified Sawyer-Tower circuit used for dc P–V measurements.

Imprint was produced in the ferroelectric capacitors 102, 104 by two different methods. In the first method, a 30 kHz unipolar (positive) pulse of approximately 10 V peak to peak (p—p) (roughly the saturation voltage) was applied for $10^9$ or more cycles. The P–V curves were measured before and after application of the pulses using a Radiant Technologies RT66A tester. In the second method, a large (27 V) dc signal was applied for a period of up to one hour. DC hysteresis loops were then obtained by slowing stepping the voltage across a modified Sawyer-Tower circuit [See Schubring, N. W.; Nolta, J. P.; Dork, R. A. Review of Scientific Instruments 35 1517–1521 (1964)], and measuring the voltages across the ferroelectric and reference capacitors 102, 104 using high impedance electrometers. A preferred measuring circuit 200 is shown schematically in FIG. 2.

The preferred method for reducing imprint in ferroelectric devices by depoling the ferroelectric is as follows. A bipolar pulse shape signal, such as a sinusoidal signal, preferably at an amplitude on the order of the saturation voltage for the particular ferroelectric material and thickness used. For a PZT material having a thickness of approximately 200 nm, an amplitude of 10 Vp–p at 500 Hz, is applied for 0.1 s (50 cycles). The signal amplitude is then gradually decreased in predetermined time intervals, preferably every 0.1 seconds, in steps of a predetermined voltage, preferably 0.01 Vp–p to a minimum voltage value, preferably 10 mV. The results are not sensitive to the AC frequency used or the decreasing step size. This method, has been shown to recover the virgin state in previously poled PZT.

Those of skill in the art will recognize that a sinusoidal wave is used by way of example only, and not to limit the scope of the invention. Any bipolar pulse shape can be utilized without departing from the scope or spirit of the methods of the present invention. For example, square waves and sawtooth waves can also be used in the methods of the present invention. Furthermore, the signal does not have to be maintained in between time intervals in fact, it may be turned off completely between the time interval steps.

Figure 3:
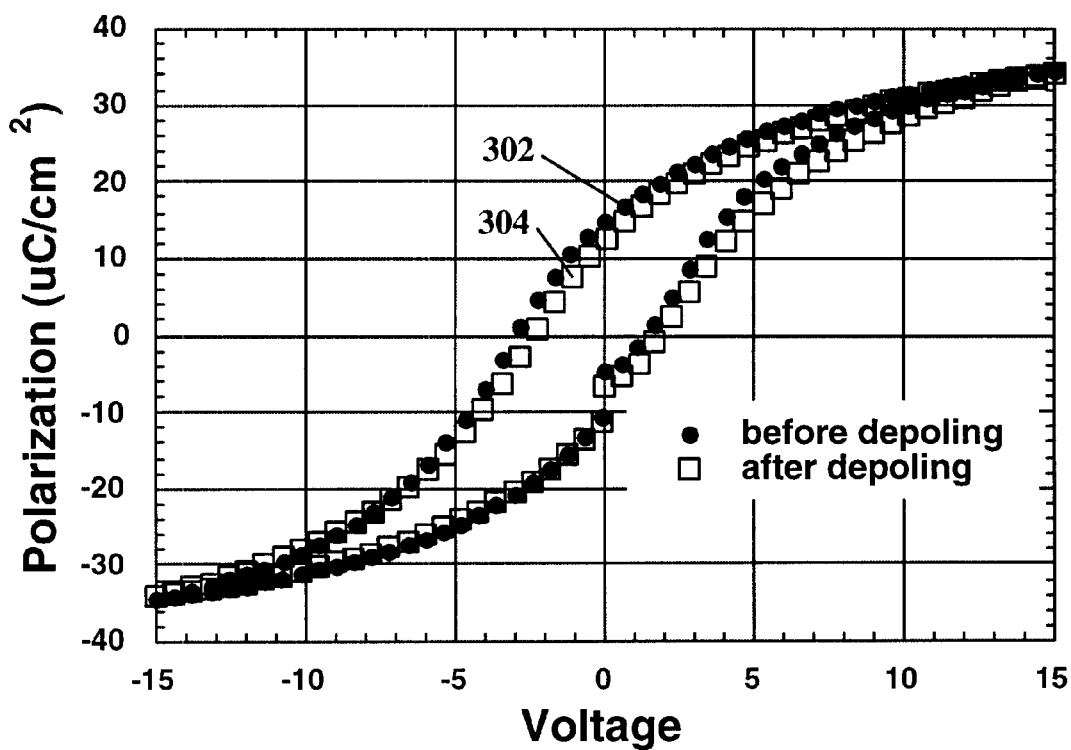
FIG. 3 illustrates a graph showing a reduction of voltage shift in a P–V loop after a single depoling sequence of the methods of the present invention.

Referring now to FIG. 3, therein is shown hysteresis loops 302, 304 for an imprinted sample ferroelectric device before (302, designated therein by diamond shaped points) and after (304, designated therein by circular points) the depoling method described above. In this example the imprint was caused by unipolar pulses. Those of skill in the art will recognize from FIG. 3 that the depoling method of the present invention as described above results in a reduction of voltage shift (i.e., imprint) in the P–V loop.

Figure 4:
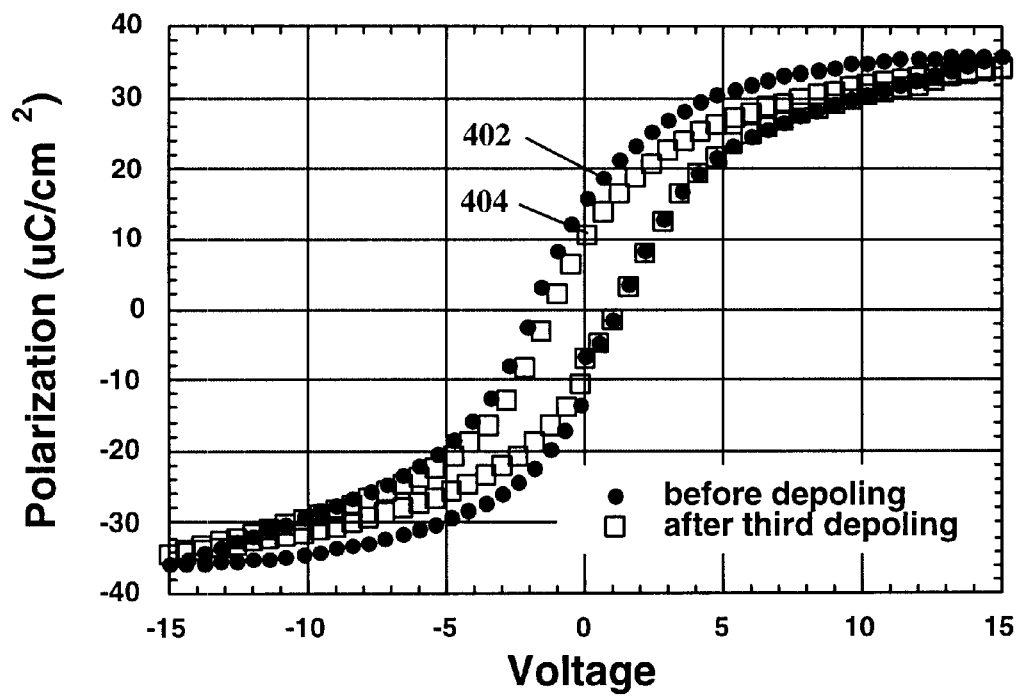
FIG. 4 illustrates a graph showing a complete recovery of original hysteresis loop after applying three depoling sequences of the methods of the present invention.

Referring now to FIG. 4, therein is shown hysteresis loops 402, 404 where the ferroelectric device has undergone a repeated number of the depoling methods as described above. Those skilled in the art will recognize, from FIG. 4, that repeating the depoling methods described above results in the complete recovery of the original hysteresis loop. For the results illustrated in FIG. 4, the depoling method described above was repeated three times. The hysteresis loop before depoling 402 is designated in FIG. 4 by circular points and the hysteresis loop after the third depoling is designated in FIG. 4 by square points.

Figure 5:
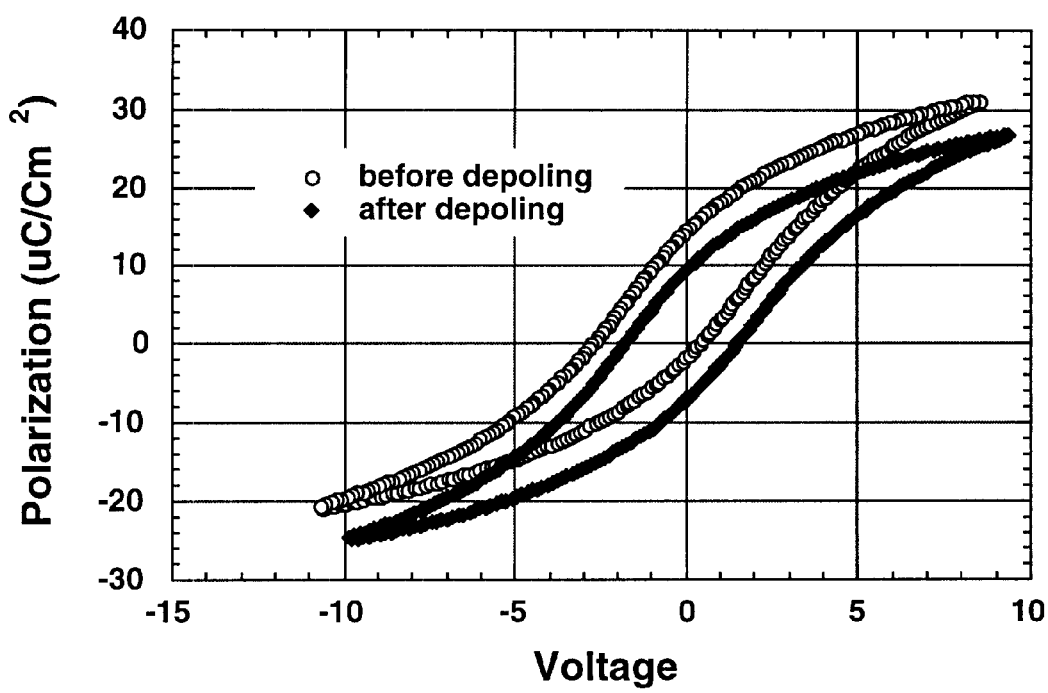
FIG. 5 illustrates a graph showing a recovery of symmetric hysteresis loop after a single depoling sequence of the methods of the present invention.

More dramatic effects can be seen in the DC hysteresis loops. After applying a 35 V dc signal for 1 hour, a large offset is seen both in V and P. The shift in P is presumably due to some remanent polarization. These shifts are typically removed by software in commercial ferroelectric testing instruments such as the RT66A. As shown in FIG. 5, the shifts are removed and the symmetry of the loop restored after once depoling the ferroelectric device.

The methods for reducing imprint in ferroelectric devices of the present invention can be carried out in a computer by periodically applying depoling pulses to a ferroelectric memory cell. Those skilled in the art will recognize that the methods of the present invention, as applied to computer memory is much more practical and economical then the methods of the prior art.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. An apparatus for reducing imprint in a ferroelectric device, the apparatus comprising:

means for applying a signal having a bipolar pulse shape for a predetermined time to the ferroelectric device; and means for decreasing the signal amplitude gradually in predetermined intervals of time and amplitude.

2. The apparatus of claim 1, wherein the bipolar shape signal is a sinusoidal wave.

3. The apparatus of claim 1, wherein the bipolar shape signal is a square wave.

4. The apparatus of claim 1, wherein the bipolar shape signal is a sawtooth wave.

5. The apparatus of claim 1, wherein the ferroelectric device is a capacitor.

6. The apparatus of claim 1, wherein the ferroelectric device is a memory cell.

7. The apparatus of claim 1, wherein the bipolar shape signal has an amplitude on the order of the saturation voltage for a ferroelectric material and thickness used in the ferroelectric device.

8. The apparatus of claim 7, wherein the ferroelectric material is PZT having a thickness of 200 nm and the bipolar shape signal has an amplitude of 10 Vp–p and a frequency of 500 Hz.

9. The apparatus of claim 8, wherein the predetermined interval of time is 0.1 seconds.

10. The apparatus of claim 8, wherein the predetermined interval of amplitude is 0.01 Vp–p.

11. The apparatus of claim 1, further comprising the step of repeating the applying and decreasing steps a predetermined number of times for recovering the imprint.

12. The apparatus of claim 11, wherein the predetermined number of times is three.

* * * * *